United States Patent
Berthold et al.

(10) Patent No.: US 7,342,421 B2
(45) Date of Patent: *Mar. 11, 2008

(54) CMOS CIRCUIT ARRANGEMENT

(75) Inventors: Jörg Berthold, Munich (DE); Ralf Brederlow, Munich (DE); Christian Pacha, Munich (DE); Klaus Von Arnim, Herzhorn (DE)

(73) Assignee: Infineon Technologies AG, Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 10/573,362

(22) PCT Filed: Sep. 17, 2004

(86) PCT No.: PCT/DE2004/002079

§ 371 (c)(1),
(2), (4) Date: Dec. 18, 2006

(87) PCT Pub. No.: WO2005/031973

PCT Pub. Date: Apr. 7, 2005

(65) Prior Publication Data

US 2007/0085567 A1    Apr. 19, 2007

(30) Foreign Application Priority Data

Sep. 24, 2003 (DE) ............................... 103 44 374
Oct. 15, 2003 (DE) ............................... 103 48 018

(51) Int. Cl.
H03K 19/096 (2006.01)
H03K 19/20 (2006.01)

(52) U.S. Cl. ....................................... 326/98; 326/121
(58) Field of Classification Search ............... 326/83, 326/95–98, 119, 121, 122
See application file for complete search history.

(56) References Cited

U.S. PATENT DOCUMENTS 5,247,212 A    9/1993    Vinal
(Continued)

OTHER PUBLICATIONS

Shih-Fen Huang et al., "High Performance 50 nm CMOS Devices for Microprocessor and Embedded Processor Core Applications", Technical Digest. International Electron Devices Meeting, 2001, Seiten 11.1.1 bis 11.1.4, 0-7803-7052-X/01/$10.00 (C) 2001 IEEE.

(Continued)

Primary Examiner—Daniel Chang
(74) Attorney, Agent, or Firm—Dicke, Billig & Czaja, PLLC

(57) ABSTRACT

In an embodiment of the invention, a CMOS circuit arrangement is provided. The CMOS circuit arrangement includes a PMOS logic circuit providing a logic function, having PMOS field effect transistors, wherein a first operating potential is fed to an input of a PMOS logic circuit, an NMOS logic circuit providing the logic function, having NMOS field effect transistors, a first clock transistor, the first source/drain terminal of which is coupled to an input of the NMOS logic circuit, wherein a clock signal is applied to the gate terminal of the first clock transistor, and wherein a second operating potential is fed to the second source/drain terminal. An output of the PMOS logic circuit and an output of the NMOS logic circuit are coupled to one another. Furthermore, an inverter circuit is coupled to the output of the PMOS logic circuit and to the output of the NMOS logic circuit. At least a portion of the NMOS field effect transistors of the NMOS logic circuit have a first threshold voltage and at least a portion of the PMOS field effect transistors of the PMOS logic circuit have a third threshold voltage. The first clock transistor has a second threshold voltage. The first threshold voltage is lower than the second threshold voltage.

22 Claims, 10 Drawing Sheets

U.S. PATENT DOCUMENTS

| | | | |
|---|---|---|---|
| 5,612,638 A * | 3/1997 | Lev | 326/98 |
| 6,329,874 B1 | 12/2001 | Ye et al. | |
| 6,590,425 B2 | 7/2003 | Murabayashi et al. | |
| 2002/0009013 A1 | 1/2002 | Lee | |
| 2003/0052371 A1 | 3/2003 | Matsuzaki et al. | |

OTHER PUBLICATIONS

Shih-Fen Huang et al., "Scalability and Biasing Strategy for CMOS with Active Well Bias", 2001 Symposium on VLSI Technology Digest of Technical Papers, 4-89114-013-5/00/$10.00 (C) 2001 IEEE.

F. Murabayashi et al., "2.5 V CMOS Circuit Techniques for a 200 MHz Superscaler RISC Processor", IEEE Journal of Solid-State Circuits, vol. 31, No. 7, Jul. 1996, 0018-9200/96$05.00 © 1996 IEEE.

A. Solomatnikov et al., "Skewed CMOS: Noise-Immune High-Performance Low-Power Static Circuit Family", To appear in 26$^{th}$ European Solid-State Circuits Conference (ESSCIRC), Sep. 19-21, 2000.

D. Harris et al., "Skew-Tolerant Domino Circuits", IEEE Journal of Solid-State Circuits, vol. 32, No. 11, Nov. 1997, 0018-9200/97$10.00 © 1997 IEEE.

T. Inukai et al., "Boosted Gate MOS (BGMOS): Device/Circuit Cooperation Scheme to Achieve Leakage-Free Giga-Scale Integration", Proceedings of the Custom Integrated Circuits Conference, Seiten 409-412, 2000.

V. Gerousis, "Design and Modeling Challenges for 90 NM and 50 NM", Invited Paper, IEEE 2003 Custom Integrated Circuits Conference, pp. 353-360, 0-7803-7842-3/03/$17.00 © 2003 IEEE.

* cited by examiner

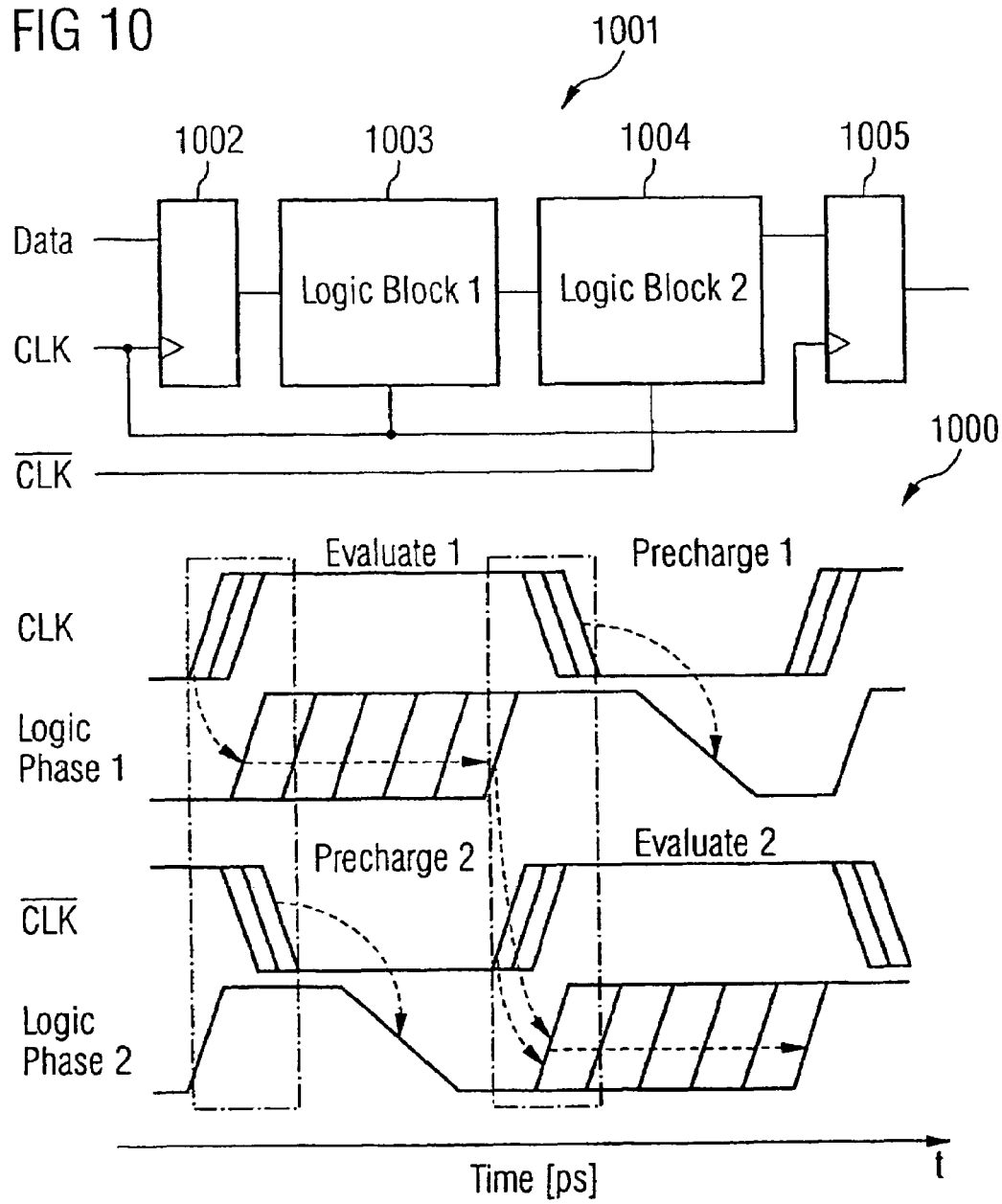

CMOS CIRCUIT ARRANGEMENT

CROSS REFERENCE TO RELATED APPLICATION

This Utility Patent Application claims the benefit of the filing dates of German Application No. DE 103 44 374.6, filed Sep. 24, 2003, German Application No. DE 103 48 018.8, filed Oct. 15, 2003, and International Application No. PCT/DE2004/002079, filed Sep. 17, 2004, both of which are herein incorporated by reference.

BACKGROUND

As CMOS technology (Complementary Metal Oxide Semiconductor) is scaled into a range of feature sizes smaller than 100 nm, the subthreshold currents and gate currents that occur in the CMOS field effect transistors increase on account of the reduced threshold voltages and the thin gate oxides of the CMOS field effect transistors. If an integrated CMOS circuit is in a non-active state, that is to say if the electrical signals at the inputs and the outputs of a CMOS circuit arrangement are constant with respect to time, then the leakage current components effect a static power loss leading to an undesirable discharge of the battery particularly in portable devices such as a mobile radio device (mobile phone) or a Personal Digital Assistant (PDA). The leakage current components in modern CMOS circuits are acquiring an increasing importance.

In a modern CMOS process there are usually a plurality of types of transistors with different threshold voltages and oxide thicknesses (cf. S. F. Huang et al., High performance 50 nm CMOS devices for microprocessor and embedded processor core applications, Technical Digest. International Electron Devices Meeting 2001, pages 11.1.1 to 11.1.41). If reducing the leakage currents (for example, upper limit: $I_{OFF}$=10 pA/μm transistor width at T=25° C.) is a primary aim of the circuit design, CMOS field effect transistors with thicker gate oxide (for example, gate oxide layer thickness=2.3 nm instead of gate oxide layer thickness=1.6 nm for a 90 nm CMOS process) are used. However, this requires a higher supply voltage ($V_{DD}$=1.2 V instead of $V_{DD}$=1.0 V) and at the same time causes the propagation time of the logic gates with CMOS field effect transistors with thicker gate oxide to increase by up to a factor of 2 in comparison with a solution with CMOS field effect transistors with thin gate oxide.

To summarize, it should be noted that the trade-off between achieving a high switching speed of the CMOS circuit arrangement and a low active power consumption ($\sim CL V_{DD}^2$), on the one hand, and small leakage currents in the CMOS field effect transistor on the other hand, precisely from the standpoint of mobile applications, is one of the greatest challenges facing future CMOS-based microelectronics.

Technology solutions possibilities such as new gate dielectrics or other transistor concepts are not yet available for example for 90 nm and 65 nm CMOS technology. For this reason, technology-close circuit design must be used to find solutions at the gate level which can be implemented with the given prerequisites of a modern system-on-chip technology.

Various solutions concepts are known for reducing leakage currents in CMOS field effect transistors.

A first solution concept is based on low-leakage-current standard cell libraries (present-day standard solution).

Special standard cell libraries whose gates include transistors with thicker oxide and high threshold voltages are used for circuit components in which a defined total leakage current budget constitutes the limiting boundary condition in the circuit design.

This solution includes the increased supply voltage and the higher gate propagation time, as was explained above. Usually, in the context of mixed solutions, all time-noncritical signal paths are constructed from the low-leakage-current gates, while the time-critical signal paths include fast gates with high leakage currents. However, this mixing of different types of gates in one circuit block has the effect that the fast gates in the time-critical signal paths, numbering approximately 5%, generate up to 50% of the total leakage current in the CMOS circuit arrangement.

A second solution concept involves providing low-leakage-current power switches in conjunction with low-VT standard cell libraries.

In this method for reducing the total leakage current, logic gates are formed from transistors with a low threshold voltage and thin gate oxide (so-called low-VT transistors, LVT) and are isolated from the real supply voltage $V_{DD}$ or from the real ground $V_{SS}$ in the standby state by power switches. The power switch or the power switches are embodied as transistors with a high threshold voltage and thick gate oxide (so-called low leakage device, LLD), as illustrated in FIG. 9 (cf. T. Inukai et al., Boosted gate MOS (BGMOS): device/circuit cooperation scheme to achieve leakage-free giga-scale integration, Proceedings of the Custom Integrated Circuits Conference, pages 409-412, 2000).

FIG. 9 illustrates a CMOS circuit arrangement 900 having a CMOS circuit 901 containing NMOS field effect transistors 902 and PMOS field effect transistors 903, all the field effect transistors 902, 903 in each case having a thin gate oxide and a low threshold voltage. The CMOS circuit 901 is coupled to an operating potential $V_{DD}$ 904, on the one hand, and to a virtual ground node 905, on the other hand. A power switch transistor 906 having a thick gate oxide and a high threshold voltage is connected between the virtual ground node 905 and the ground potential 907.

All the leakage current components of the LVT block, that is to say of the CMOS circuit 901, can essentially be eliminated by this means. In a 90 nm CMOS technology platform, this method enables the leakage current to be reduced by three to four decades.

This method includes the long activation phase (10 to 100 ms compared with 1 ns clock period) before and after the switch-on of the power switch transistor 906. This prevents a fast change between an active state and the state with a reduced static power consumption. If a plurality of circuit blocks are situated on an electronic chip, then it must additionally be taken into account that the operation of active circuit blocks, by the switch-on of one or a plurality of circuit blocks, is not impaired by a collapse of the global voltage supply.

A third solution concept that is known is to alter the threshold voltage by means of a body bias voltage or substrate bias voltage.

This solution, which is also referred to as an "active well concept" or "variable $V_T$ concept", is based on the substrate control effect of the CMOS field effect transistors, by means of which the threshold voltage of the transistors can be increased or lowered during operation of a CMOS circuit. A distinction is made between the so-called reverse biasing of logic gates with a preferably low threshold voltage and the so-called forward biasing of logic gates including transistors having a high threshold voltage. In the case of reverse biasing, a negative (positive) voltage $V_{BN}<V_{SS}(V_{BP}>V_{DD})$ is applied to the bulk contact or the body contact of an NMOS (PMOS) field effect transistor. In contrast thereto, in the case of forward biasing, the voltage $0.6V>V_{BN}>0V$ ($V_{DD}>V_{BP}>V_{DD}-0.6V$) is applied to the bulk contact or the body contact of an NMOS (PMOS) field effect transistor.

In general, the active well concept can only be used efficiently if the substrate control effect is sufficiently large. Since the substrate control effect for reverse biasing is reduced in accordance with $\gamma \sim 1/C_{OX} \sim t_{OX}$ with the reduction of the gate oxide layer thickness $t_{OX}$, reverse biasing is ruled out in the medium term for transistors with a minimal channel length, as is described in Shih-Fen Huang et al., Scalability and Biasing Strategy for CMOS with Active Well Bias, 2001 Symposium on VLSI Technology Digest of Technical Papers. Reverse biasing additionally requires the provision of voltages that are higher than the supply voltage $V_{DD}$ or lower than the ground potential $V_{SS}$. The associated additional outlay (that is to say the provision of additional charge pumps) must consequently be taken into account in the overall power budget. The maximum permissible negative (positive) body potential for NMOS transistors or PMOS transistors is limited by the gate induced drain leakage (band-to-band tunneling at the drain terminal).

For the "65 nm" technology generation, reverse biasing is ruled out for leakage current reduction in particular for thin, nitrided gate oxides having a gate oxide layer thickness of less than 1.5 nm EOT, since the gate leakage current relevant there cannot be influenced by a shift in the threshold voltage. The availability of a high-k dielectric would change this basic condition. However, an introduction can be expected at the earliest in the "45 nm" technology generation.

The linearized substrate control effect for MOS transistors with pocket implantations or halo implantations is approximately $\Delta V_T \approx 0.5\ V_{T0}$ in the case of forward biasing and is thus likewise reduced proportionally to the threshold voltage $V_{T0}$ with each technology generation (cf. Shih-Fen Huang et al., Scalability and Biasing Strategy for CMOS with Active Well Bias, 2001 Symposium on VLSI Technology Digest of Technical Papers).

Therefore, forward biasing is of interest particularly for accelerating logic circuits which are constructed from LLD transistors having a relatively high threshold voltage ($VT \approx 400$ mV). Forward biasing results here in a performance gain of approximately 7% at the nominal supply voltage of $V_{DD}=1.2$ V. The performance gain increases to approximately 30% at a reduced supply voltage of $V_{DD}=0.7$ V.

The use of forward biasing is less efficient for a circuit including transistors having a low threshold voltage ($V_T \approx 200$ mV). In general, the substrate voltage in the case of forward biasing is limited by the exponentially rising PN junction leakage currents to the range $V_{BN}<0.5$ V (NMOS transistor) or $V_{BP}>V_{DD}-0.5$ V (PMOS transistor). Above this value, the PN junctions in the respective transistor become conducting.

A fourth solution concept that is known is to apply a leakage-current-minimizing bit pattern (so-called minimum leakage vector).

The basis of this concept is the bit pattern dependence of the leakage current in a CMOS logic gate having a plurality of inputs and series circuits (stack effect) of CMOS transistors. The leakage currents of a logic gate may differ depending on the bit pattern by a factor of 10 to 20 depending on the number of CMOS transistors situated in series, that is to say connected in series, and depending on the dimensionings of the CMOS transistors.

Ideally, in a circuit block including N logic gates, all N logic gates would be in the state with minimal leakage current. For this purpose, at the beginning of the standby state, a special bit pattern is fed into the input registers of a complex logic circuit block (for example, 16-bit multiplier, 32-bit adder, digital filter, etc.) and the clock is switched off.

This bit pattern is valid at the input of the logic gates for the duration of the non-active state.

Since CMOS circuits include a large number of cascaded logic gates which are arranged in many divergent and convergent signal paths, for a circuit block of this type the minimum leakage current can be set only with difficulty via the application of a bit pattern. The main difficulty consists in actually determining the bit pattern with the minimum leakage current in the case of, for example, 2×32 bit input vectors and blocks having a depth of 8 to 20 cascaded logic gates.

However, the method enables the fast activation and reactivation of a logic block (few clock cycles). This results in a higher flexibility in comparison with the solution with the power switches.

Furthermore, a static logic with monotonic logic transitions is known in F. Murabayashi et al., 2.5 V CMOS circuit techniques for a 200 MHz superscalar RISC processor, IEEE Journal of Solid-State Circuits, Vol. 31, No. 7, pages 972 to 980, July 1996 and A. Solomatnikov, D. Somasekhar, K. Roy, Skewed CMOS: Noise-Immune High-Performance Low-Power Static Circuit Family, Proc. of 26th European Solid-State Circuits Conference (ESSCIRC), 19-21 Sep. 2000. The aim of the circuits in accordance with F. Murabayashi et al., 2.5 V CMOS circuit techniques for a 200 MHz superscalar RISC processor, IEEE Journal of Solid-State Circuits, Vol. 31, No. 7, pages 972 to 980, July 1996 and A. Solomatnikov, D. Somasekhar, K. Roy, Skewed CMOS: Noise-Immune High-Performance Low-Power Static Circuit Family, Proc. of 26th European Solid-State Circuits Conference (ESSCIRC), 19-21 Sep. 2000 is to provide a robust high-speed logic for microprocessors as a replacement for the so-called dynamic domino logic, which is susceptible to interference.

Furthermore, D. Harris, M. A. Horowitz, Skew-Tolerant Domino Circuits, IEEE Journal of Solid-State Circuits, Vol. 32, No. 11, pages 1702-1711, November 1997 describes a clock scheme for a pipeline stage in accordance with the "skew-tolerant domino" principle.

US 2003/0052371 A1 describes a circuit arrangement using static CMOS circuit technology in which a power switch is provided locally for a respective logic gate, the respective logic gate having NMOS field effect transistors and PMOS field effect transistors having identical threshold voltages.

U.S. Pat. No. 6,590,425 B2 describes a circuit arrangement having a logic function block including NMOS field effect transistors that provides a logic function and having a logic function block including PMOS field effect transistors that provides the logic function. Furthermore, a first clock transistor is connected between the logic function block including NMOS field effect transistors and the ground potential and a second clock transistor is connected between the operating potential and the outputs of both logic function blocks. All the transistors in the circuit arrangements in accordance with U.S. Pat. No. 6,590,425 B2 have the same threshold voltage and the same oxide layer thicknesses.

US 2002/0009013 A1 describes an interface circuit for a high-speed semiconductor device.

U.S. Pat. No. 6,329,874 B1 describes a circuit arrangement having a leakage current control transistor, to which an amplified gate driver signal is applied during an active mode.

SUMMARY

One embodiment of the invention specifies a CMOS circuit arrangement having a short propagation time and a low leakage current.

One embodiment provides a CMOS circuit arrangement having a PMOS logic circuit realizing a logic function. The PMOS logic circuit has a plurality, in one case a multiplicity, of PMOS field effect transistors. A first operating potential can be fed or is fed to an input of the PMOS logic circuit. Furthermore, the CMOS circuit arrangement has an NMOS logic circuit realizing the logic function, having a plurality, in one case having a multiplicity, of NMOS field effect transistors. Furthermore, a first clock transistor is provided, the first source/drain terminal of which is coupled to an input of the NMOS logic circuit, it being possible for a clock signal to be applied, or a clock signal being applied, to the gate terminal of the first clock transistor, and it being possible for a second operating potential to be fed, or a second operating potential being fed, to the second source/drain terminal. An output of the PMOS logic circuit and an output of the NMOS logic circuit are coupled to one another. In one case, a second clock transistor is provided, the first source/drain terminal of which is coupled to the output of the PMOS logic circuit and to the output of the NMOS logic circuit, it being possible for the clock signal to be applied, or the clock signal being applied, to the gate terminal of the second clock transistor, and it being possible for the first operating potential to be fed, or the first operating potential being fed, to the second source/drain terminal. An inverter circuit that is likewise contained in the CMOS circuit arrangement is coupled to the output of the PMOS logic circuit and to the output of the NMOS logic circuit. The respective gate oxide layer of at least a portion of the NMOS field effect transistors of the NMOS logic circuit has a first oxide layer thickness. The gate oxide layer of the first clock transistor has a second oxide layer thickness. The first layer thickness is smaller than the second layer thickness.

In other words, the clock transistors in each case have a thick gate oxide layer and that at least a portion, in one case all, of the NMOS field effect transistors of the NMOS logic circuit in each case have a thin gate oxide layer. This technology is also referred to as multi-gate oxide circuit technology.

In this context, the expression "thick gate oxide layer" is to be understood to mean that it is thicker than a "thin gate oxide layer".

To express it another way, the transistors having a thick gate oxide layer are configured as so-called low leakage devices (LLD field effect transistors) and transistors having a thin gate oxide layer are in one case configured as so-called low-VT field effect transistors.

One aspect of the invention can be seen in the fact that the first clock transistor performs a dual function, namely additionally functions as a power switch transistor.

Consequently, in one embodiment of the present invention transistors with thin gate oxide and a low threshold voltage (LVT field effect transistors) and transistors with thicker gate oxide and a high threshold voltage (LLD field effect transistors) are used jointly in a complex CMOS gate.

One embodiment of the invention thus goes beyond the multi-VT concepts realized in the art. Following the classification of the concepts for leakage current reduction as discussed above, one embodiment constitutes a skillful uniting of the second solution concept with the fourth solution concept, that is to say the use of power switches and the minimum leakage vector principle.

One embodiment of the invention results in the realization of logic circuits having short propagation times and low leakage currents.

The above-described trade-off between performance and leakage current in a low standby power application can be lessened by one embodiment of the present invention.

One area of application is that of regular data path structures in system-on-chip applications with a low active and static power consumption and also moderate requirements made of the speed (clock frequencies 500 MHz to 1 GHz for 90 nm CMOS technology). These include in particular embedded microprocessors (for example, ARM or MIPS family) and digital signal processing processors such as are used, for example, in a mobile phone chipset or in an electronic communication component.

One aspect of the invention can be seen in the fact that the predetermined logic function is in each case completely realized, to express it a different way provided, by a PMOS logic circuit and an NMOS logic circuit, the respective PMOS field effect transistors of the PMOS logic circuit having a different (smaller or larger) threshold voltage than the respective NMOS field effect transistors of the NMOS logic circuit.

In one case where a second clock transistor is provided, the gate oxide layer of the second clock transistor is thicker than the respective gate oxide layer of at least the portion of the NMOS field effect transistors of the NMOS logic circuit.

In accordance with one refinement of the invention, the respective gate oxide layer of at least a portion of the PMOS field effect transistors of the PMOS logic circuit has a third oxide layer thickness, the first layer thickness being smaller than the third layer thickness. To express it another way, the PMOS field effect transistors of the PMOS logic circuit are in one case set up as field effect transistors each having a thick gate oxide layer, that is to say as LLD field effect transistors.

In accordance with one refinement of the invention, the inverter circuit has a PMOS field effect transistor and an NMOS field effect transistor.

In one case, the PMOS field effect transistor and the NMOS field effect transistor of the inverter circuit have a gate oxide layer having a fourth layer thickness, the first layer thickness being smaller than the fourth layer thickness. To express it another way, the PMOS field effect transistor and the NMOS field effect transistor of the inverter circuit are in one case set up as field effect transistors each having a thick gate oxide layer, that is to say as LLD field effect transistors.

In accordance with another development of the invention, it is provided that the gate oxide layer of the NMOS field effect transistor of the inverter circuit is thicker than the gate oxide layer of the PMOS field effect transistor of the inverter circuit. In this case, a first power switch transistor is connected between the PMOS field effect transistor of the inverter circuit and the first operating potential, the gate oxide layer of said first power switch transistor being thicker than the gate oxide layer of the PMOS field effect transistor of the inverter circuit. To express it another way, the first power switch transistor is set up as field effect transistors each having a thick gate oxide layer, that is to say as LLD field effect transistors.

In this case, the PMOS field effect transistor of the inverter circuit, on account of the higher driver capability, can be given smaller dimensioning than for the case where the PMOS field effect transistor of the inverter circuit has a thick gate oxide.

The inverse clock signal can be applied or is applied to the gate terminal of the first power switch transistor.

A first field effect transistor may be connected between the PMOS field effect transistor of the inverter circuit and the first operating potential, the gate oxide layer of said first field effect transistor being thinner than the gate oxide layer of the NMOS field effect transistor of the inverter circuit. To express it another way, the first field effect transistor is set up as a field effect transistor having a thin gate oxide layer, that is to say as an LVT field effect transistor.

Furthermore, a second field effect transistor may be connected between the input of the inverter circuit and the second operating potential, the gate oxide layer of said second field effect transistor being thicker than the gate oxide layer of the first field effect transistor. To express it another way, the second field effect transistor is set up as a field effect transistor having a thick gate oxide layer, that is to say as an LLD field effect transistor.

In accordance with another refinement of the invention, it is provided that a second power switch transistor is connected between the second field effect transistor and the second operating potential, the gate oxide layer of said second power switch transistor being thicker than the gate oxide layer of the first field effect transistor. To express it another way, the second power switch transistor is set up as a field effect transistor having a thick gate oxide layer, that is say as an LLD field effect transistor.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 10 illustrates a pipeline structure with a plurality of CMOS circuit arrangements according to an embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
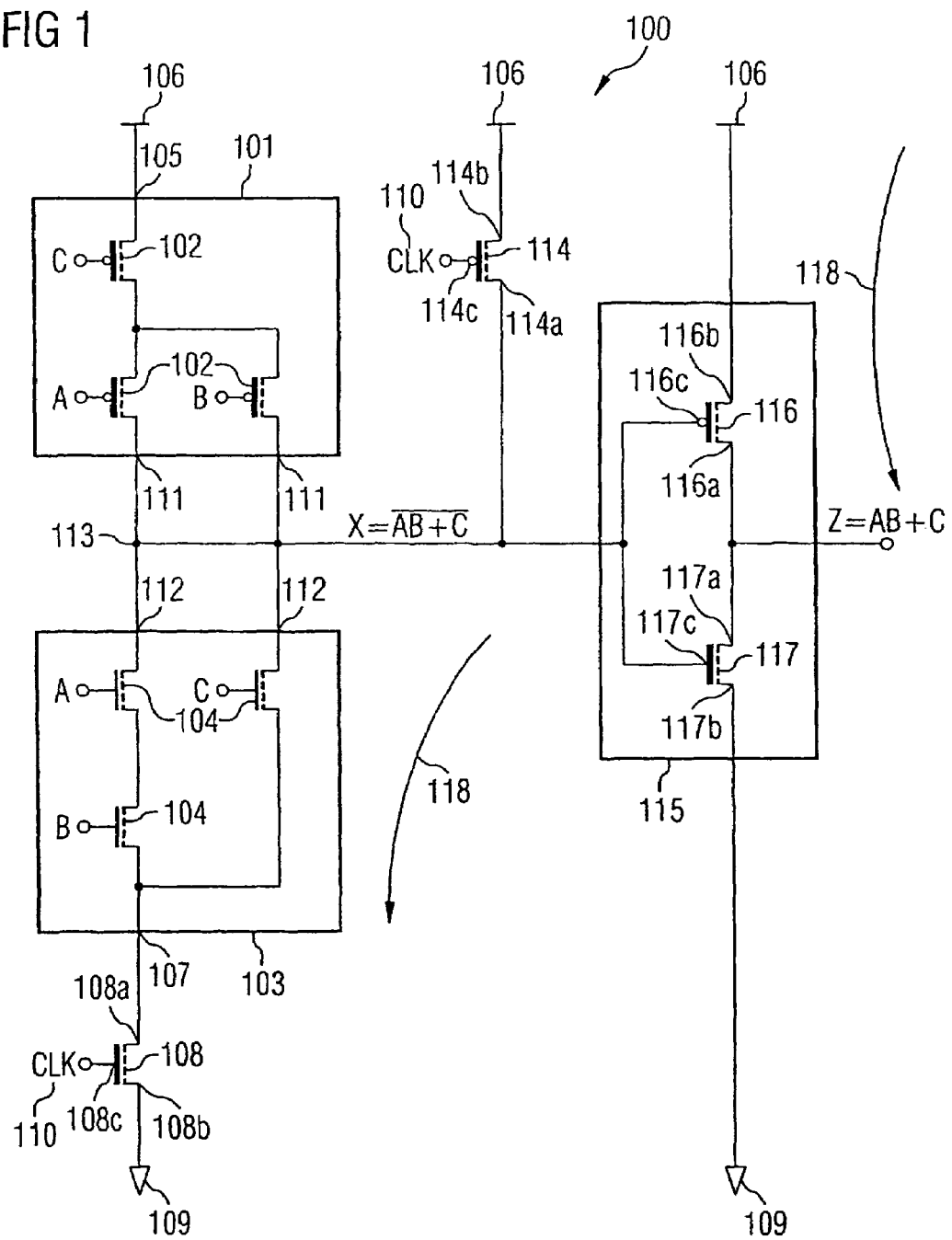
FIG. 1 illustrates a CMOS circuit arrangement in accordance with a first exemplary embodiment of the invention.

FIG. 1 illustrates a CMOS circuit arrangement 100 in accordance with a first exemplary embodiment of the invention.

The CMOS circuit arrangement 100 has a PMOS logic circuit 101 having a multiplicity of PMOS field effect transistors 102 which are connected up in such a way that they provide a predetermined logic function. To express it another way, the PMOS field effect transistors 102 form a PMOS logic gate. The gate oxide layers of the PMOS field effect transistors 102 of the PMOS logic circuit 101 have a thickness of 2.3 nm and the gate width of the PMOS field effect transistors 102 of the PMOS logic circuit 101 is 320 nm. The PMOS field effect transistors 102 of the PMOS logic circuit 101 are thus set up as LLD transistors.

The CMOS circuit arrangement 100 furthermore has an NMOS logic circuit 103 having a multiplicity of NMOS field effect transistors 104 which are connected up in such a way that they provide the same predetermined logic function as the PMOS field effect transistors 102 of the NMOS logic circuit 103. To express it another way, the NMOS field effect transistors 104 form an NMOS logic gate. The gate oxide layers of the NMOS field effect transistors 104 of the NMOS logic circuit 103 have a thickness of 1.3 nm and the gate width of the NMOS field effect transistors 104 of the NMOS logic circuit 103 is 640 nm. The NMOS field effect transistors 104 of the NMOS logic circuit 103 are thus set up as LVT transistors.

A voltage supply input 105 of the PMOS logic circuit 101 is directly coupled to a first operating potential $V_{DD}$ 106.

A voltage supply input 107 of the NMOS logic circuit 103 is coupled to a first source/drain terminal 108a of a first clock transistor 108, the second source/drain terminal 108b of which is coupled directly to a second operating potential $V_{SS}$ 109. A clock signal CLK 110 is applied to the gate terminal 108c of the first clock transistor 108. The gate oxide layer of the first clock transistor 108 formed as an NMOS field effect transistor has a thickness of 2.3 nm and the gate width of the first clock transistor 108 is 640 nm. The first clock transistor 108 is thus formed as an LLD transistor.

According to one embodiment of the invention, the PMOS field effect transistors 102 of the PMOS logic circuit 101 are given smaller dimensioning than the NMOS field effect transistors 104 of the NMOS logic circuit 103.

Outputs 111 of the PMOS logic circuit 101 and outputs 112 of the NMOS logic circuit 103 are coupled to an intermediate node 113 and thus to one another.

Furthermore, a first source/drain terminal 114a of a second clock transistor 114 is coupled to the intermediate node 113, the second source/drain terminal 114b of said second clock transistor being coupled to the first operating potential $V_{DD}$ 106. The clock signal CLK 110 is applied to the gate terminal 114c of the second clock transistor 114. The gate oxide layer of the second clock transistor 114 formed as a PMOS field effect transistor has a thickness of 2.3 nm and the gate width of the second clock transistor 114 is 640 nm. The first clock transistor 114 is thus formed as an LLD transistor.

Furthermore, the CMOS circuit arrangement 100 has an inverter circuit 115 having a PMOS field effect transistor 116 and an NMOS field effect transistor 117.

The gate terminal 116c of the PMOS field effect transistor 116 of the inverter circuit 115 and the gate terminal 117c of the NMOS field effect transistor 117 of the inverter circuit 115, that is to say the input of the inverter circuit 115, are coupled to the intermediate node 113. A first source/drain terminal 116a of the PMOS field effect transistor 116 of the inverter circuit 115 and a first source/drain terminal 117a of the NMOS field effect transistor 117 of the inverter circuit 115 are coupled to one another and form the output of the inverter circuit 115 and the output of the CMOS circuit arrangement 100. A second source/drain terminal 116b of the PMOS field effect transistor 116 of the inverter circuit 115 is coupled to the first operating potential $V_{DD}$ 106. A second source/drain terminal 117b of the NMOS field effect transistor 117 of the inverter circuit 115 is coupled to the second operating potential $V_{SS}$ 109.

In accordance with these exemplary embodiments, the logic gates, that is to say the logic circuits 101, 103, form the logic function X=AB+C, the PMOS logic circuit 101 being formed from LLD transistors and the NMOS logic circuit 103 being formed from LVT transistors. A fast "1-0" transition of the logic signal levels is thus realized in the input stage, namely by the NMOS logic circuit 103. The AND-OR logic function represents by way of example any arbitrary complex logic combination. Any other logic function can be realized according to embodiments of the invention. The PMOS field effect transistors 102 of the input stage, that is to say of the PMOS logic circuit 101, are given minimal dimensioning. The fast transitions during an evaluation phase are indicated by arrows 118.

Figure 2:
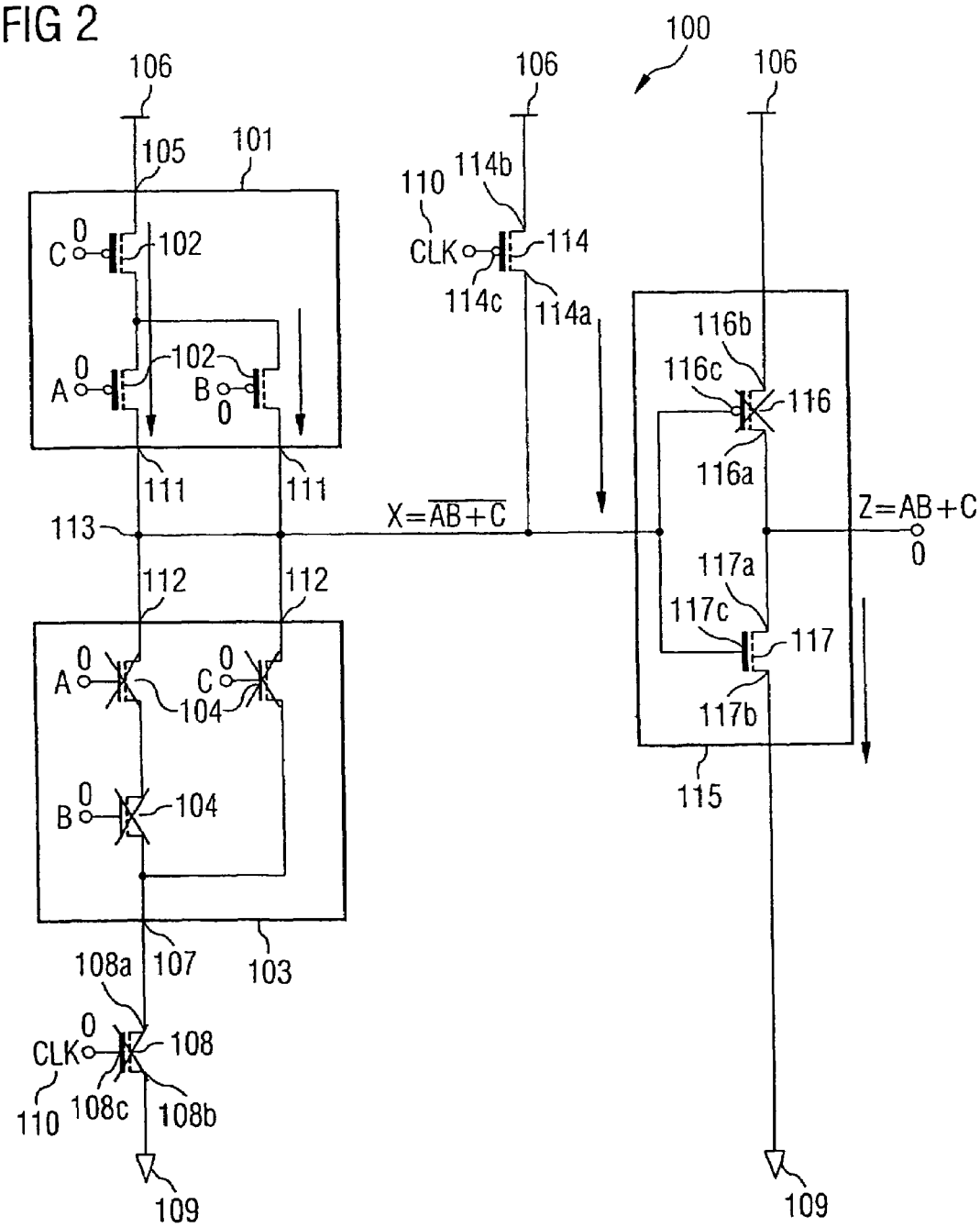
FIG. 2 illustrates an illustration of the low standby power state of the CMOS circuit arrangement in accordance with the first exemplary embodiment of the invention.

FIG. 2 illustrates the CMOS circuit arrangement 100 in accordance with the first exemplary embodiment from FIG. 1 in the low standby power state of the logic gate.

The subthreshold currents of the NMOS LVT transistors 104 are prevented by the first clock transistor 108. On account of the thicker gate oxide of the PMOS field effect transistors 102, no gate leakage currents flow through the switched-on PMOS field effect transistors 102 in the input branch.

The deactivated transistors are indicated with a cross in FIG. 2. The activated transistors are indicated with an arrow in FIG. 2. Furthermore, the logic values which represent the voltage levels present at the input terminals are specified with "0" for a level of 0 V and with "1" for a level of 1.2 V.

Some basic properties of the CMOS circuit arrangement according to the invention are illustrated in FIG. 1 and FIG. 2 and can be summarized as follows:

a) Separation of Calculation and Amplification

The calculation and the amplification, that is to say the two basic functions of a logic gate are embodied separately in two stages. Situated in the 1st stage (NMOS logic circuit 103) is a complex CMOS logic combination, the time-critical 1-0 transition of which is accelerated by the switch-on of the NMOS LVT transistors. The 2nd stage includes the inverter circuit 115 including LLD transistors 116, 117, which only amplifies this signal, converts it into a 0-1 transition and finally charges the gate capacitances of the subsequent logic gates to the "1" potential, that is to say to the first operating potential $V_{DD}$.

b) Multi-gate oxide and Multi-$V_T$ Technique in a Logic Gate

All of the transistors which are responsible for a short propagation time within a CMOS logic gate are realized by LVT types with thin gate oxide (for example, EOT=1.6 nm).

For all the remaining transistors, the LLD type (for example, EOT=2.3 nm) is used in order to ensure minimum leakage currents. Depending on the requirement, transistors having different threshold voltages can be used here. In a modem sub-100 nm technology there are typically two to three threshold voltages present per gate oxide thickness.

An asymmetrical dimensioning of the NMOS branch and of the PMOS branch is additionally taken into consideration. In contrast to the conventional static CMOS logic, the NMOS LVT transistors in the input stage have a larger transistor width than the PMOS transistors of the input branch. PMOS transistors usually have 1.5 times to 2 times the gate width of an NMOS transistor. Dispensing with this conventional dimensioning brings about a lower logic gate input capacitance and hence faster propagation times and lower leakage currents (which are proportional to the transistor width).

c) Monotonic Logic Transitions and Two-phase Operation of Multistage Circuits

In order to be able to utilize the preferred direction generated by different gate oxides, different threshold voltages and asymmetrical width dimensioning in a fast logic transition, the logic gate in FIG. 1 has to be initialized in a suitable manner before the beginning of the evaluation phase, that is to say a bit pattern is to be applied to the input in such a way that the intermediate node X 113 is charged to the first operating potential $V_{DD}$ 106 and the output Z of the inverter circuit 115 is discharged to the second operating potential $V_{SS}$ 109. This initialization operation (comparable to the precharge operation in dynamic logic) is effected during the clock phase CLK=0. In the evaluation phase, which is initiated by the rising clock edge, the internal intermediate node X 113 of the logic gate can discharge rapidly, if appropriate, on account of the measures carried out under b), whereupon the output node Z of the inverter circuit 115 is rapidly charged to the first operating potential $V_{DD}$115 (cf. FIG. 1). The output signal at the output node Z of the inverter circuit 115 thereupon remains at a constant electrical potential for the duration of the active phase of the clock signal CLK=1.

The initialization operation or precharge operation at CLK=0, which is effected by the LLD PMOS transistors in the input stage, that is to say in the PMOS logic circuit 101, and the second clock transistor 114 and by the LLD NMOS transistor 117 of the inverter circuit 115, typically has a duration that is approximately four times to eight times as long as that of the fast transition and is "hidden" in the clock phase CLK=0.

In an alternative embodiment of the invention, the second clock transistor 114 is omitted. Instead, the PMOS field effect transistors 102 of the PMOS logic circuit 101 are redimensioned, that is to say that their width is increased, in one case by approximately a factor of two compared with the width of the PMOS field effect transistors 102 of the PMOS logic circuit 101 for the case where the second clock transistor 114 is present.

This corresponds to the idea known per se of a static logic with monotonic logic transitions such as is described in F.

Murabayashi et al., 2.5 V CMOS circuit techniques for a 200 MHz superscalar RISC processor, IEEE Journal of Solid-State Circuits, Vol. 31, No. 7, pages 972 to 980, July 1996 and A. Solomatnikov, D. Somasekhar, K. Roy, Skewed CMOS: Noise-Immune High-Performance Low-Power Static Circuit Family, Proc. of 26th European Solid-State Circuits Conference (ESSCIRC), 19-21 Sep. 2000.

It should be noted, however, that, in contrast to embodiments of the present invention, F. Murabayashi et al., 2.5 V CMOS circuit techniques for a 200 MHz superscalar RISC processor, IEEE Journal of Solid-State Circuits, Vol. 31, No. 7, pages 972 to 980, July 1996 and A. Solomatnikov, D. Somasekhar, K. Roy, Skewed CMOS: Noise-Immune High-Performance Low-Power Static Circuit Family, Proc. of 26th European Solid-State Circuits Conference (ESSCIRC), 19-21 Sep. 2000 have the aim of finding a robust high-speed logic for microprocessors as a replacement for the dynamic domino logic, which is susceptible to interference. Different gate oxides are not used there. Cascaded logic gates (multistage logic) are operated according to the two-phase precharge-evaluate principle as in dynamic domino logic, the fast transitions taking place during the evaluation phase (CLK=1).

FIG. 10 presents the "skew-tolerant domino" principle according to D. Harris, M. A. Horowitz, Skew-Tolerant Domino Circuits, IEEE Journal of Solid-State Circuits, Vol. 32, No. 11, pages 1702-1711, November 1997 as an example of a suitable clock scheme 1000 for a pipeline stage according to one embodiment of the invention. In this case, using the overlapping clock phases it is possible to dispense with a latch in the center of the signal path. In accordance with D. Harris, M. A. Horowitz, Skew-Tolerant Domino Circuits, IEEE Journal of Solid-State Circuits, Vol. 32, No. 11, pages 1702-1711, November 1997 and exactly as in the case of domino-logic-based pipeline stages, it is also possible to use a four-phase or n-phase overlapping clock scheme. Without restricting the generality, the circuit technology presented can, however, also be operated with non-overlapping clock phases and latches between the logic circuit blocks of the data path (standard solution).

d) Reduction of the Leakage Current through Simultaneous Use of the First Clock Transistor as Power Switch The first clock transistor 108 depicted in FIG. 1 is accorded a particular importance in order to reduce the leakage current of the logic gate. One aspect of the invention is to embody the first clock transistor 108 as a low-leakage-current device and thus to use it simultaneously as a power switch.

The leakage currents of the LVT NMOS logic branch are eliminated in this way. FIG. 2 illustrates the low-leakage-current state of the logic gate. Besides the high threshold voltage of the first clock transistor 108, the stack effect in the LVT NMOS series circuit also becomes effective, if appropriate, during the standby state.

The monotonic logic transitions make it possible, in a relatively large circuit block with arbitrarily cascaded logic gates, to set that state which has the minimum leakage current in each logic gate.

FIG. 2 illustrates that a logic "0" is established at the output of the inverter circuit 105 if the clock signal 110 CLK=0 and the input signals of the logic circuits A=B=C=0.

This means that the inputs of subsequent logic gates, that is to say logic gates connected downstream, are also set to the logic value "0" and this state propagates through the entire logic circuit block.

The negative effects of the higher threshold voltage and of the thicker gate oxide of the first clock transistor 108 on the 1-0 transition of the intermediate node X 113 are reduced or compensated for by virtue of the fact that the initiation of the evaluation phase is effected on the rising clock edge of the clock signal CLK 110 (cf. FIG. 10) and thus temporally precedes the signal transitions in cascaded logic gates.

This double utilization of the first clock transistor 108 is one aspect of the invention.

In all the illustrated exemplary embodiments of the invention, the calculation of the logic function by fast NMOS LVT transistors 104 takes place in the first stage, that is to say in the NMOS logic circuit 103.

The realization of a logic calculation by fast PMOS LVT transistors in the second logic stage, which merely includes an inverter in the first exemplary embodiment, is likewise conceivable and part of exemplary embodiments four and five.

A technological prerequisite for this is a sufficient driver capability of the PMOS LVT transistors and a limiting of the PMOS transistors connected in series (typically two, a maximum of three).

If reducing the active power loss is the primary design aim, exemplary embodiments four and five are the good solution approaches.

Figure 3:
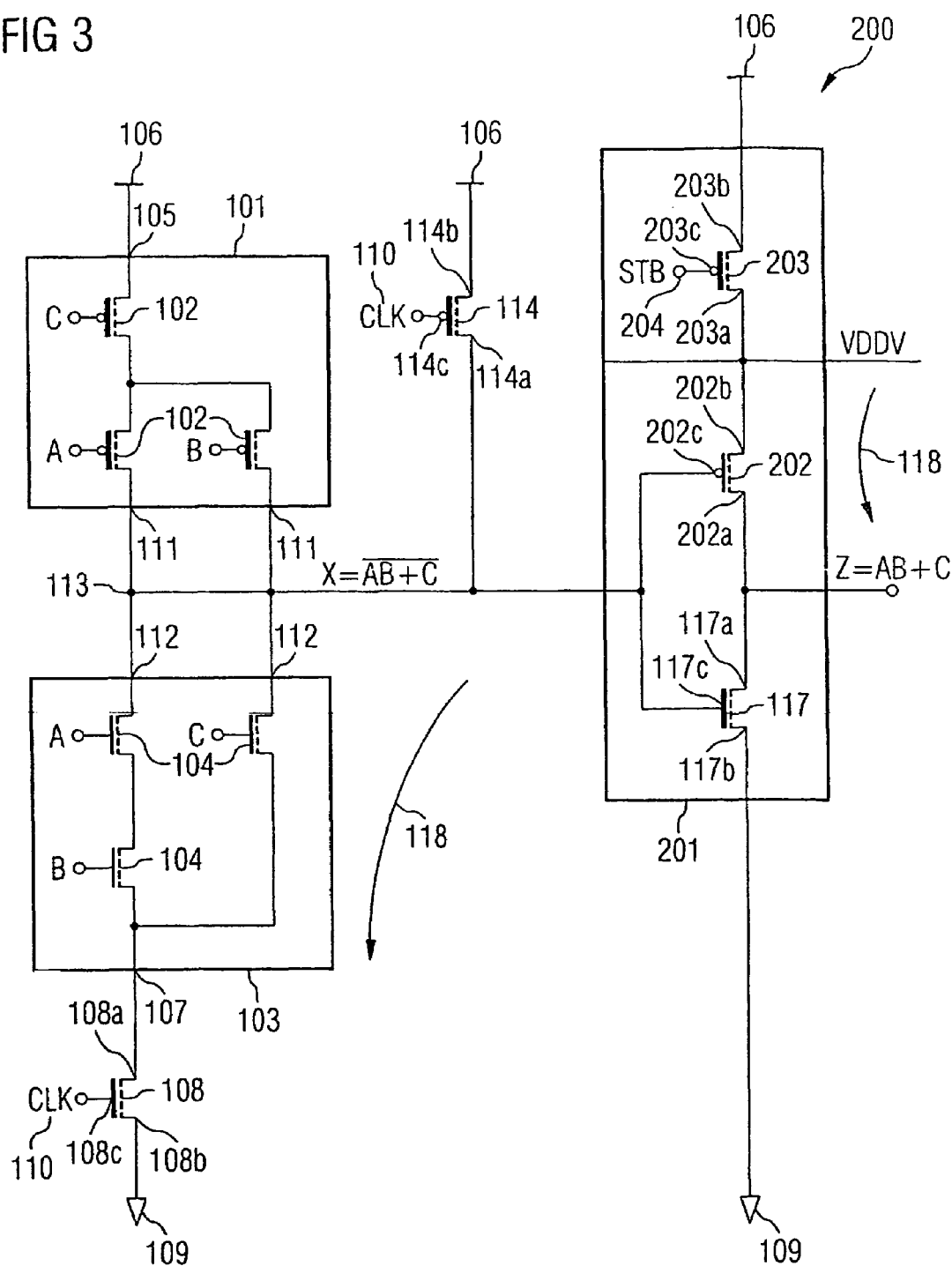
FIG. 3 illustrates a CMOS circuit arrangement in accordance with a second exemplary embodiment of the invention.

FIG. 3 illustrates a CMOS circuit arrangement 200 in accordance with a second exemplary embodiment of the invention.

In contrast to the CMOS circuit arrangement 100 in accordance with the first exemplary embodiment, the pull-up branch of the inverter circuit 201 in the second stage has a series circuit including a PMOS LVT transistor 202, the gate terminal 202c of which is connected to the internal intermediate node X 113, and an LLD power switch transistor 203.

The first source/drain terminal 202a of the PMOS LVT transistor 202 is coupled to the first source/drain terminal 117a of the second transistor 117. The second source/drain terminal 202b of the PMOS LVT transistor 202 is coupled to the first source/drain terminal 203a of the LLD power switch transistor 203, the second source/drain terminal 203b of which is coupled to the first operating potential $V_{DD}$ 106. A power switch control signal 204 is applied to the gate terminal 203c of the LLD power switch transistor 203.

On account of the higher driver capability, the PMOS LVT transistor 202 can be given smaller dimensioning than the PMOS LLD transistor 116 in the first exemplary embodiment. The LLD power switch transistor 203 and the virtual supply voltage $V_{DDV}$ can both be shared with adjacent logic gates and be embodied separately for each logic gate.

Figure 4:
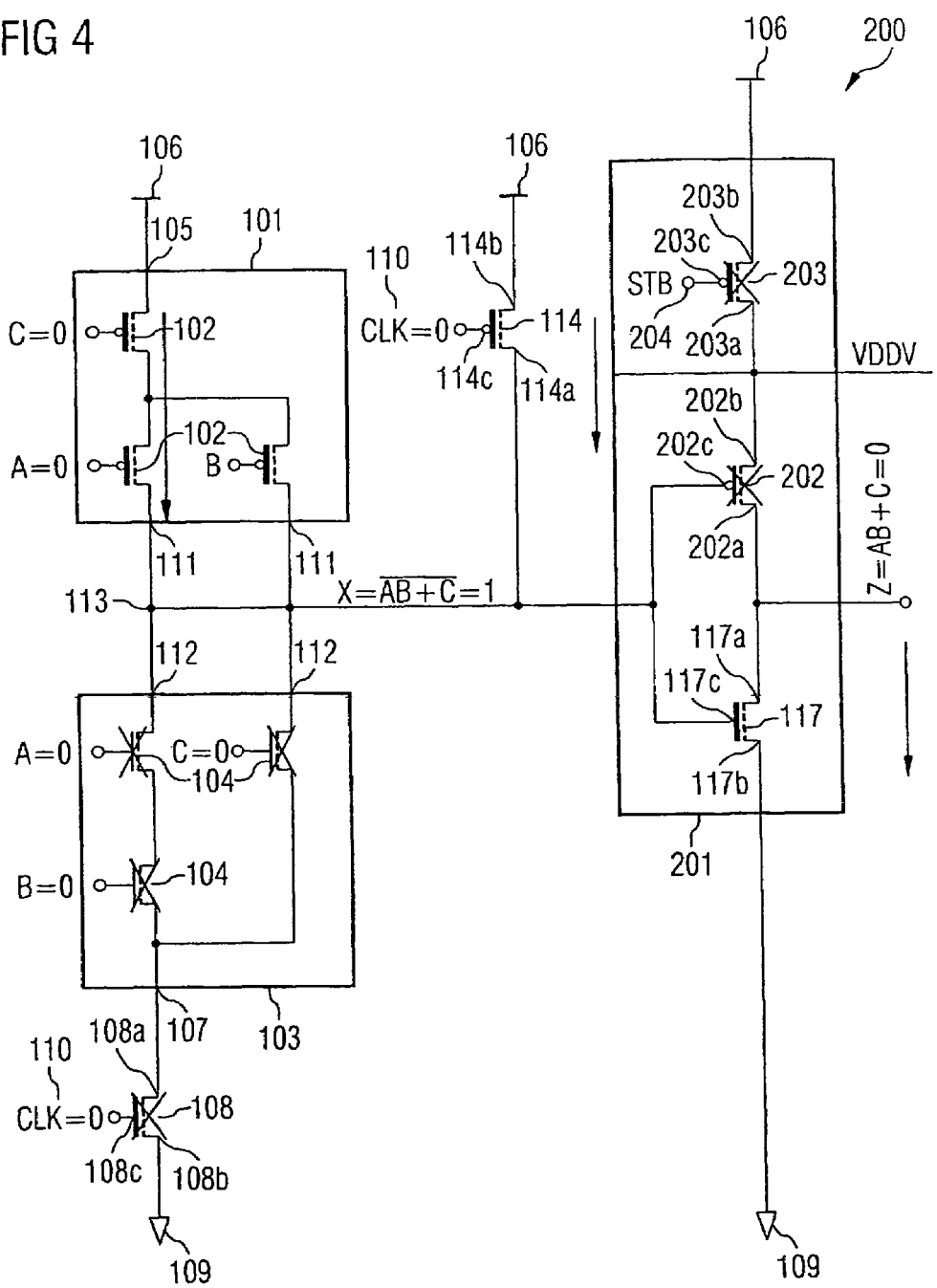
FIG. 4 is an illustration of the low standby power state of the CMOS circuit arrangement in accordance with the second exemplary embodiment of the invention.

FIG. 4 illustrates the low standby power state of the CMOS circuit arrangement 200 in accordance with the second exemplary embodiment of the invention, in particular its NMOS logic gate 103.

The subthreshold currents of the NMOS LVT transistors 104 are prevented by the first clock transistor 108. The LLD power switch transistor 203 prevents the subthreshold currents of the PMOS LVT transistor 202 in the inverter.

Figure 5:
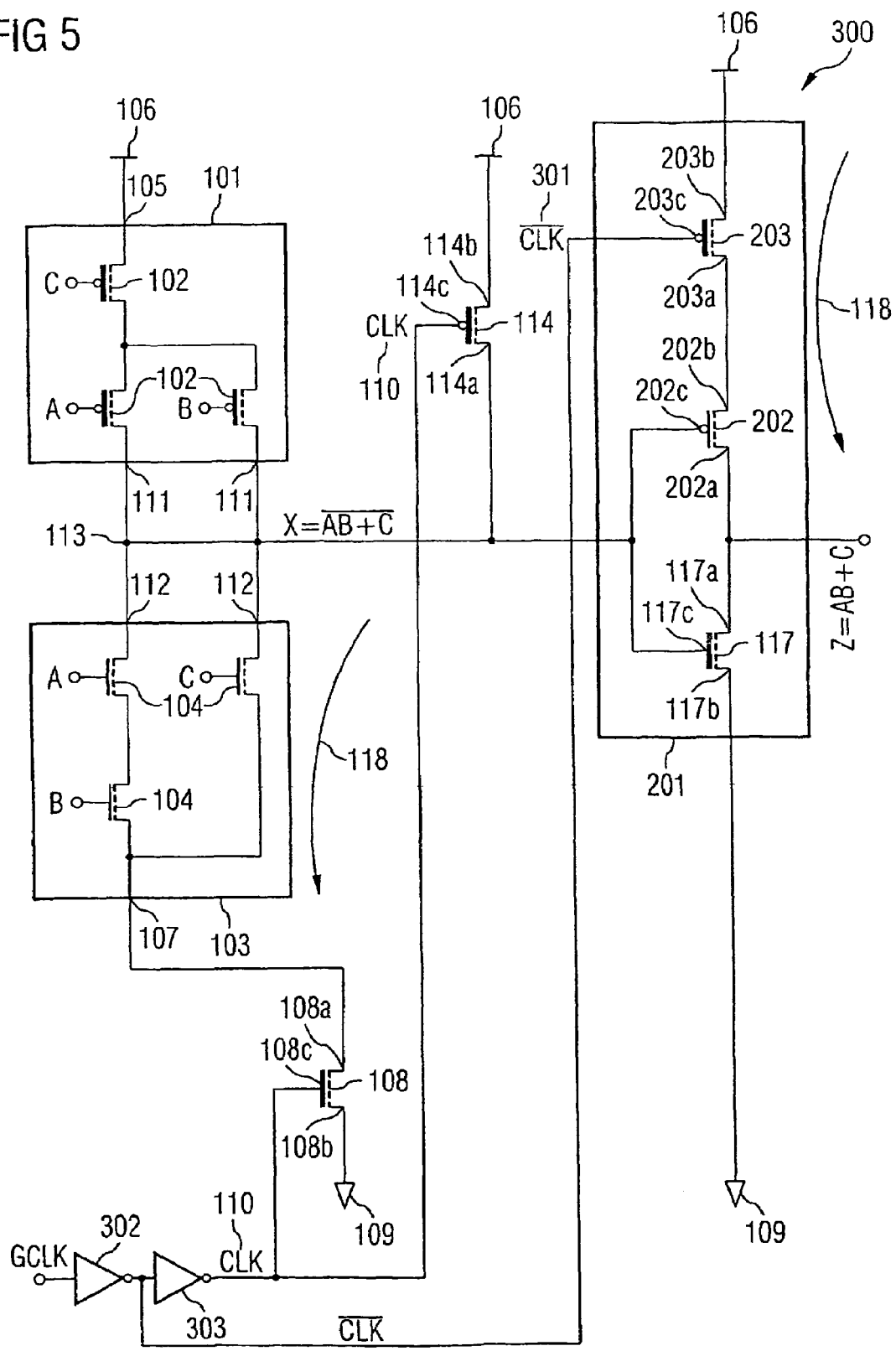
FIG. 5 illustrates a CMOS circuit arrangement in accordance with a third exemplary embodiment of the invention.

FIG. 5 illustrates a CMOS circuit arrangement 300 in accordance with a third exemplary embodiment of the invention.

In contrast to the CMOS circuit arrangement 200 in accordance with the second exemplary embodiment, the LLD PMOS transistor 203 of the inverter circuit 201 is no longer controlled by the standby signal STB 204, but rather by the inverse clock signal/CLK 301, which is formed by means of a first inverter 302 and a second inverter 303.

The clocks are generated by a local clock driver comprising LLD transistors. In the standby mode, when the clock is switched off (so-called clock gating, here with CLK=0, /CLK=1), a bit pattern (X=1, Z=0) with minimal leakage current is automatically generated. The PMOS clock transistor, that is to say the LLD PMOS transistor 203, in the inverter and the NMOS clock transistor, that is to say the first clock transistor 108, in the logic stage can optionally be used for a plurality of logic gates. The gate leakage currents of the LVT transistors 104 can only flow during the active clock phase CLK=1.

Figure 6:
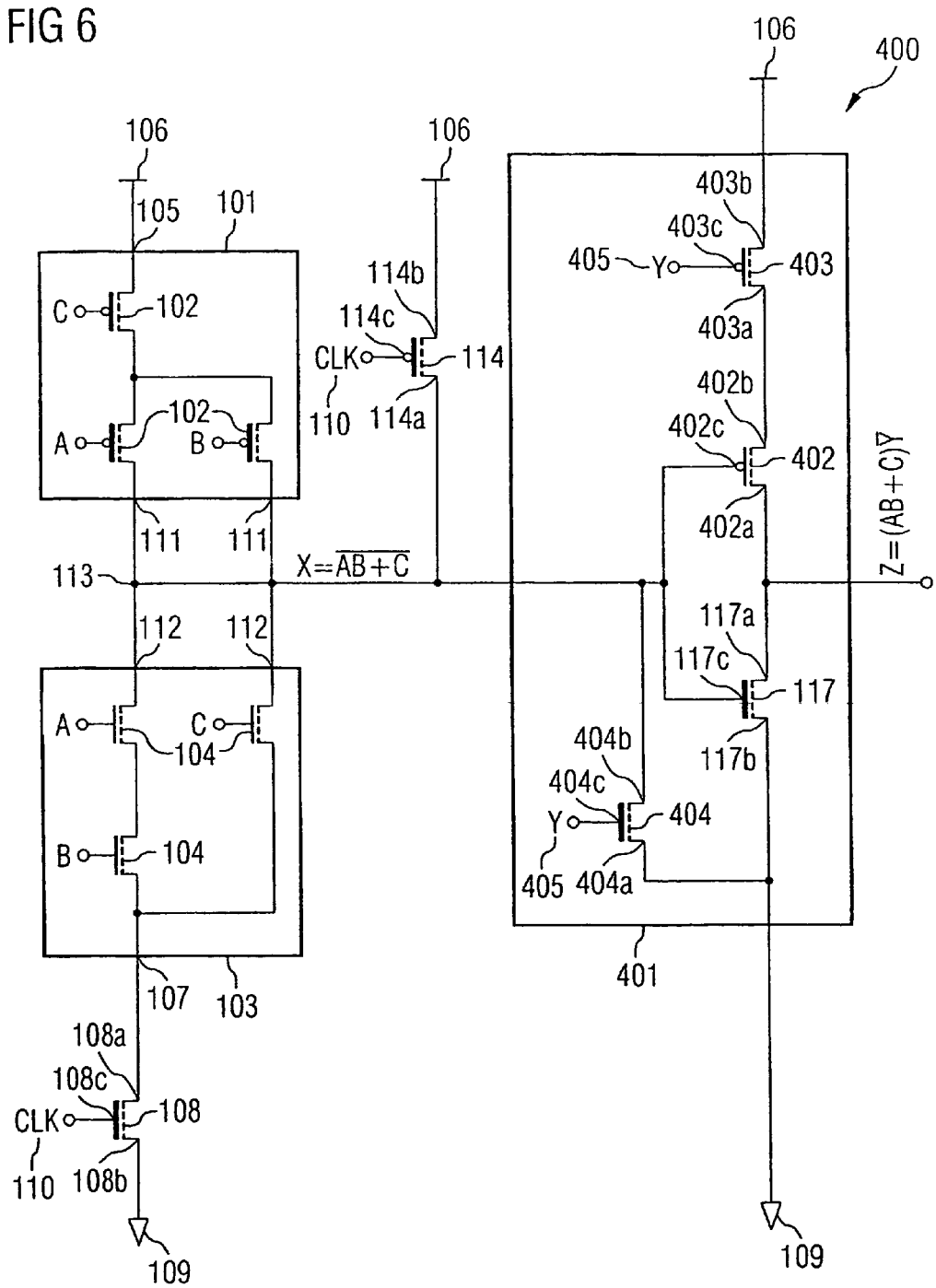
FIG. 6 illustrates a CMOS circuit arrangement in accordance with a fourth exemplary embodiment of the invention.

FIG. 6 illustrates a CMOS circuit arrangement 400 in accordance with a fourth exemplary embodiment of the invention.

The CMOS circuit arrangement 400 in accordance with the fourth exemplary embodiment of the invention provides a cascading of two logic gates with a fast "1-0" transition (1st stage) and a fast "0-1" transition (2nd stage).

The fast 1-0 transition is realized by a clocked logic gate with NMOS LVT transistors. Logic gates according to this principle are also referred to hereinafter as NMOS stage. The gate for the fast 0-1 transition, that is to say the logic circuit 401, has PMOS LVT transistors 402, 403. This gate is also referred to hereinafter as PMOS stage. The logic functions X=/(AB+C) and Z=/(X+Y)=(AB+C)/Y are representative of arbitrary complex CMOS logic gates. Complete data signal paths are constructed by the cascading of gates in accordance with the sequence NMOS stage/PMOS stage/NMOS stage, etc. The outputs of all the NMOS stages are precharged to the first operating potential $V_{DD}$ 106 in the precharge phase. The outputs of the PMOS stages are indirectly precharged to the second operating potential $V_{SS}$ 109.

The CMOS circuit arrangement 400 in accordance with the fourth exemplary embodiment differs from the CMOS circuit arrangement 100 in accordance with the first exemplary embodiment more precisely in the construction of the logic function realized in the 2nd stage.

The logic circuit 401 in accordance with the CMOS circuit arrangement 400 has the NMOS field effect transistor 117, a first PMOS field effect transistor 402, a second PMOS field effect transistor 403 and a second NMOS field effect transistor 404. The first PMOS field effect transistor 402 and the second PMOS field effect transistor 403 are formed as LVT transistor, that is to say as transistors with a thin gate oxide having a gate oxide layer thickness of 1.3 nm, and the second NMOS field effect transistor 404 is formed as LLD transistor, that is to say as a transistor with a thick gate oxide having a gate oxide layer thickness of 2.3 nm.

The first source/drain terminal 402a of the first PMOS field effect transistor 402 is coupled to the first source/drain terminal 117a of the NMOS field effect transistor 117. Furthermore, the second source/drain terminal 402b of the first PMOS field effect transistor 402 is coupled to the first source/drain terminal 403a of the second PMOS field effect transistor 403, the second source/drain terminal 403b of which is coupled to the first operating potential $V_{DD}$ 106. The gate terminal 402c of the first PMOS field effect transistor 402 is coupled to the intermediate node 113 and a control signal Y 405 is applied to the gate terminal 403c of the second PMOS field effect transistor 403. The first source/drain terminal 404a of the second NMOS field effect transistor 404 is coupled to the second operating potential $V_{SS}$ 109 and the second source/drain terminal 404b of the second NMOS field effect transistor 404 is coupled to the intermediate node 113. The control signal Y 405 is applied to the gate terminal 404c of the second NMOS field effect transistor 404. The control signal Y 405 is generated in a logic gate with a fast NMOS logic stage but an arbitrary logic function.

Figure 7:
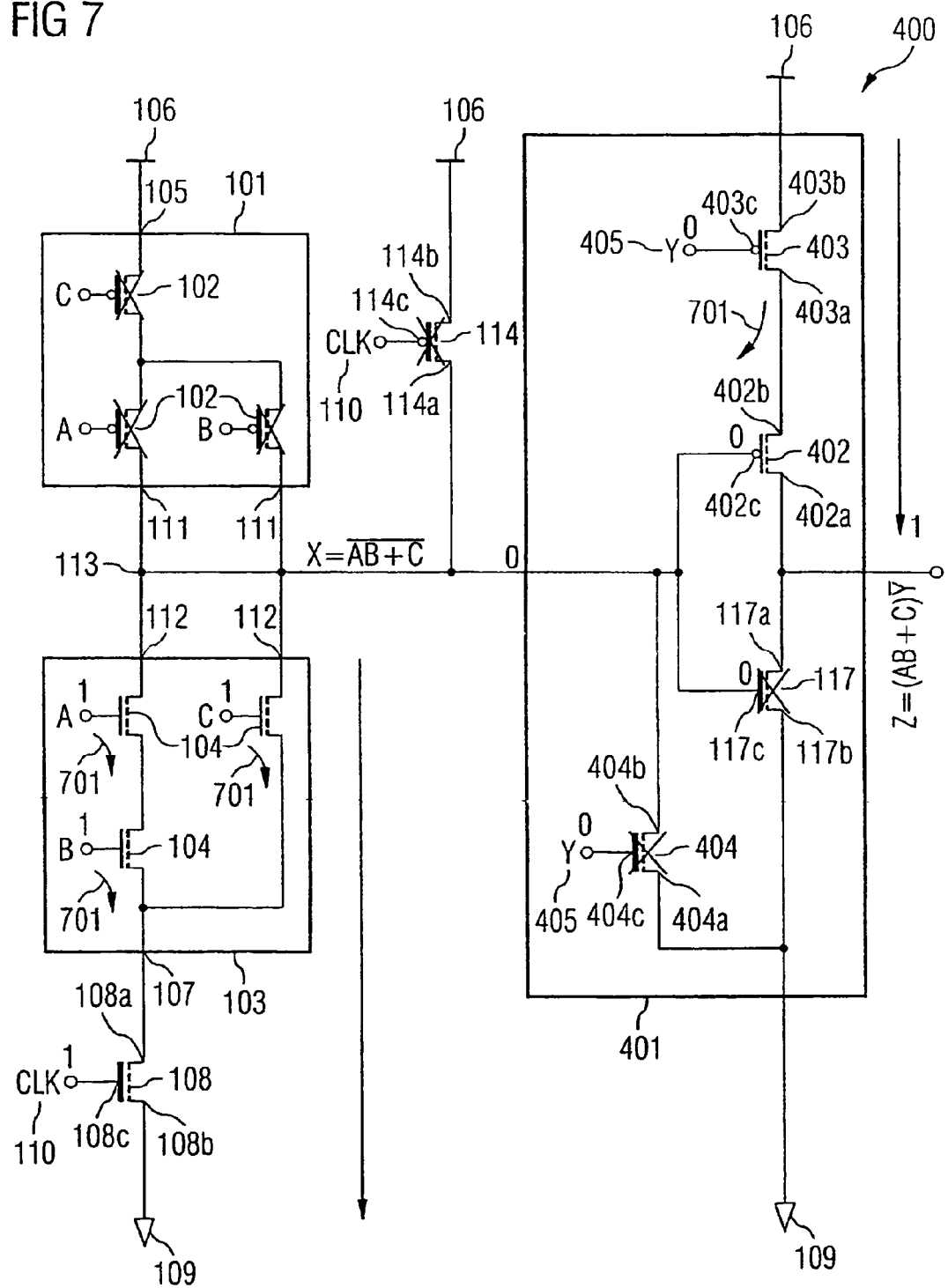
FIG. 7 is an illustration of the low standby power state of the CMOS circuit arrangement in accordance with the fourth exemplary embodiment of the invention.

FIG. 7 illustrates a second bit pattern for a state with minimal leakage current for the CMOS circuit arrangement 400 in accordance with the fourth exemplary embodiment of the invention.

In the exemplary embodiments described previously, the state with the minimal leakage current was given by the input pattern A=B=C=0 and CLK=0.

In this configuration, however, setting the clock to CLK=1 and all the inputs of the NMOS stages to A=B=C=1 is also a practical alternative.

In this way, the PMOS pull-up branch of the NMOS stage is inhibited and the output, that is to say the intermediate node X 113, is discharged to the second operating potential $V_{SS}$ 109. Since the outputs of the NMOS stages are simultaneously the inputs of the PMOS stages, all the NMOS transistors in the pull-down branch of the PMOS stage, that is to say in the branch formed by the first PMOS field effect transistor 402 and the second PMOS field effect transistor 403, are switched off. Only the gate leakage currents (indicated by arrows 701) flow in the LVT transistors 104, 402, 403.

Figure 8:
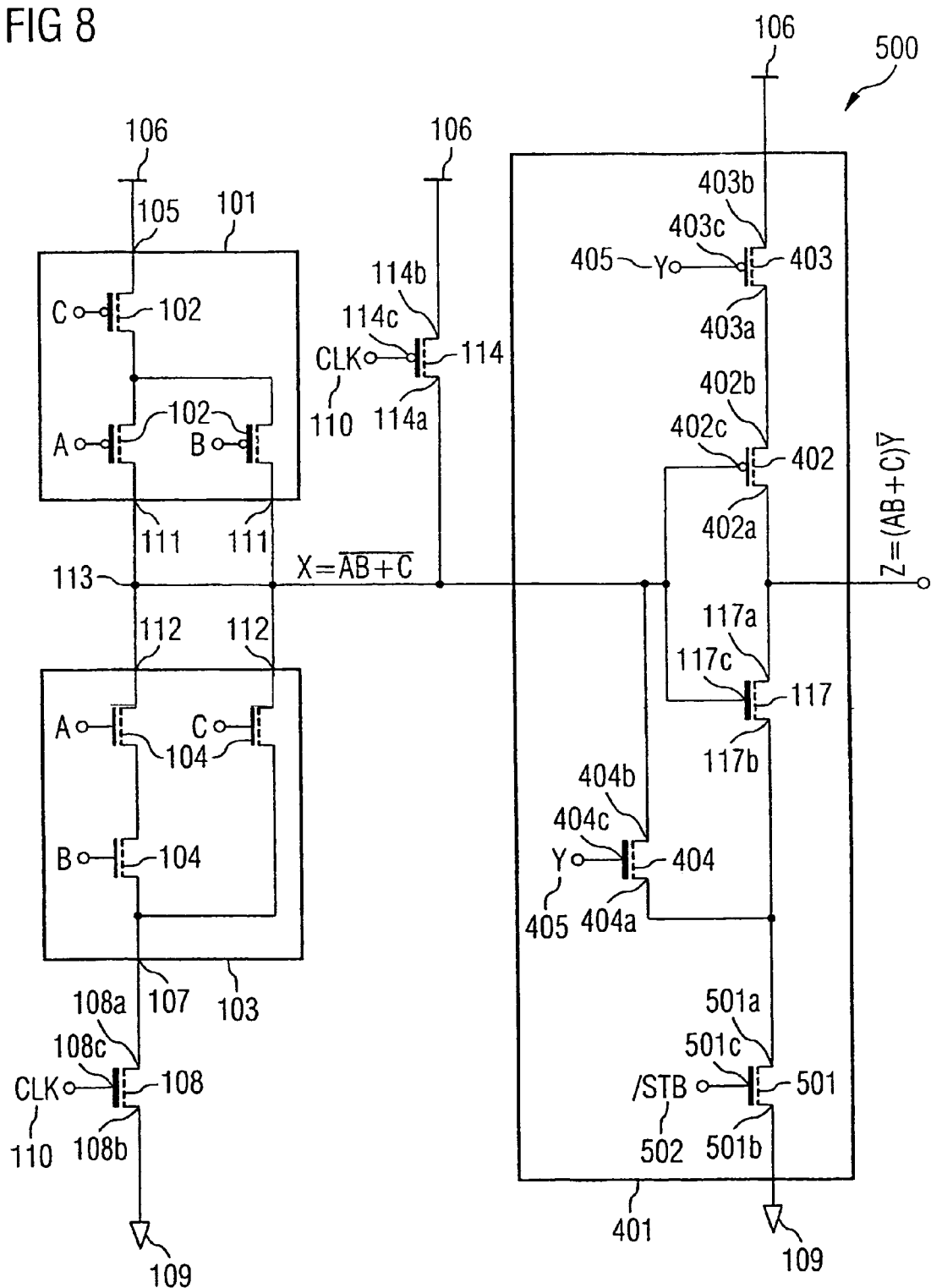
FIG. 8 illustrates a CMOS circuit arrangement in accordance with a fifth exemplary embodiment of the invention.
Figure 9:
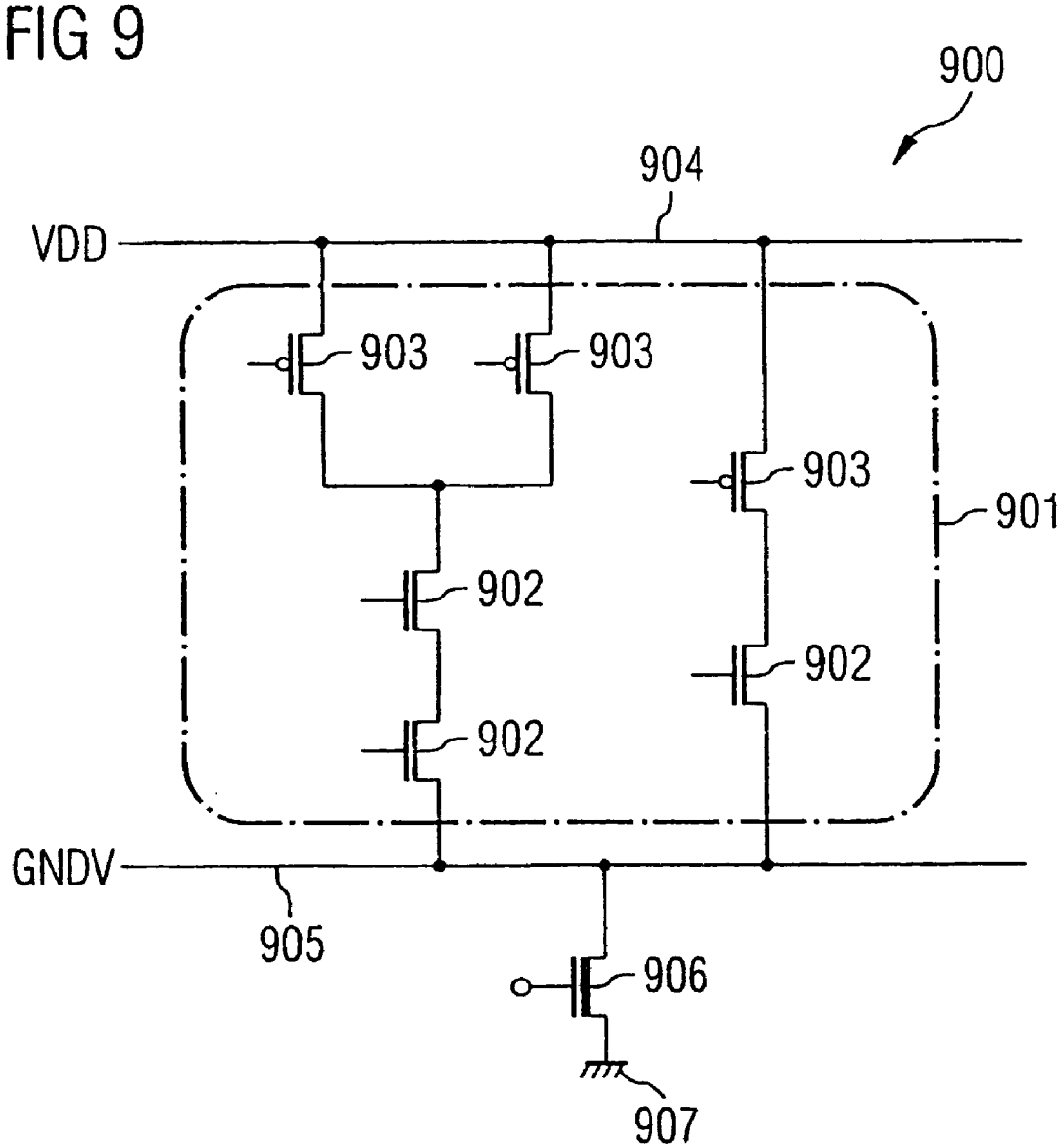
FIG. 9 illustrates a CMOS circuit arrangement in accordance with the prior art.

FIG. 8 illustrates a CMOS circuit arrangement 500 in accordance with a fifth exemplary embodiment of the invention.

The CMOS circuit arrangement 500 acquires, as an extension of the CMOS circuit arrangement 400 in accordance with the fourth exemplary embodiment, a further LLD NMOS transistor 501 in the PMOS stage, which is driven by the control signal /STB 502 and thus functions like the first clock transistor 108 as a local power switch.

More precisely, the first source/drain terminal 501a of the LLD NMOS transistor 501 is coupled to the first source/drain terminal 404a of the second NMOS field effect transistor 404 and to the second source/drain terminal 117b of the NMOS field effect transistor 117. The second source/drain terminal 501b of the LLD NMOS transistor 501 is coupled to the second operating potential 109. The control signal /STB 502 is applied to the gate terminal 501c of the LLD NMOS transistor 501.

For this purpose, the two signals are put at CLK=/STB=0 in the power-down mode. Referring to the NMOS stage, this corresponds to the low standby power state in FIG. 4. Without restricting the generality, the "0" potential of the signals CLK and /STB, relative to the second operating potential $V_{SS}$ 109, can also be chosen to be negative in order to obtain a so-called super-cut-off state, that is to say a negative gate-source voltage.

One advantage of this variant over the CMOS circuit arrangement 400 in accordance with the fourth exemplary embodiment consists, in one case, in the fact that the leakage current of the PMOS stage is reduced for CLK=0. In this state, all the outputs of the NMOS stages are at the first operating potential $V_{DD}$ 106 and all the LLD transistors in the NMOS pull-down signal path are open. Since the additional LLD series transistor is situated in the time-noncritical pull-down signal path, only the 1-0 precharge time of the PMOS stage is slightly increased. The time-critical 0-1 transition of the PMOS stage that is relevant to the maximum clock frequency is fast in an unchanged fashion in comparison with the CMOS circuit arrangement 400 in accordance with the fourth exemplary embodiment. The LLD NMOS power switch may, if appropriate, be shared with a plurality of gates.

FIG. 10 illustrates a two-phase, overlapping clock scheme used according to one embodiment of the invention for the operation of the logic presented, that is to say of the above-described circuit arrangements in a pipeline stage 1001 having an input latch 1002, a plurality of series-connected CMOS circuit arrangements 1003, 1004 according to the invention and an output latch 1005 according to the principle of "skew-tolerant domino circuits", as described in D. Harris, M. A. Horowitz, Skew-Tolerant Domino Circuits, IEEE Journal of Solid-State Circuits, Vol. 32, No. 11, pages 1702-1711, November 1997. However, any other suitable clock scheme can be used.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A integrated circuit including a CMOS circuit arrangement, comprising:
   a PMOS logic circuit providing a logic function, having PMOS field effect transistors, wherein a first operating potential is fed to an input of the PMOS logic circuit;
   an NMOS logic circuit providing the logic function, having NMOS field effect transistors;
   a first clock transistor, the first source/drain terminal of which is coupled to an input of the NMOS logic circuit, wherein a clock signal is applied to the gate terminal of the first clock transistor, and wherein a second operating potential is fed to the second source/drain terminal;
   wherein an output of the PMOS logic circuit and an output of the NMOS logic circuit are coupled to one another;
   an inverter circuit coupled to the output of the PMOS logic circuit and to the output of the NMOS logic circuit;
   wherein at least a portion of the NMOS field effect transistors of the NMOS logic circuit have a first threshold voltage;
   wherein at least a portion of the PMOS field effect transistors of the PMOS logic circuit have a third threshold voltage;
   wherein the first clock transistor has a second threshold voltage; and
   wherein the first threshold voltage is lower than the second threshold voltage.

2. The integrated circuit of claim 1, wherein the first threshold voltage is lower than the third threshold voltage, or the third threshold voltage is lower than the first threshold voltage.

3. The integrated circuit of claim 1, wherein:
   the respective gate oxide layer of at least a portion of the NMOS field effect transistors of the NMOS logic circuit has a first oxide layer thickness;
   the gate oxide layer of the first clock transistor has a second oxide layer thickness; and
   the first oxide layer thickness is smaller than the second oxide layer thickness.

4. The integrated circuit of claim 3, wherein:
   the respective gate oxide layer of at least a portion of the PMOS field effect transistors of the PMOS logic circuit has a third oxide layer thickness; and
   the first oxide layer thickness is smaller than the third oxide layer thickness.

5. The integrated circuit of claim 1, wherein:
   the respective gate oxide layer of at least a portion of the PMOS field effect transistors of the PMOS logic circuit has a third oxide layer thickness;
   the gate oxide layer of the first clock transistor has a second oxide layer thickness; and
   the third layer thickness is smaller than the second layer thickness.

6. The integrated circuit of claim 5, wherein:
   the respective gate oxide layer of at least a portion of the NMOS field effect transistors of the NMOS logic circuit has a first oxide layer thickness; and
   the third oxide layer thickness is smaller than the first oxide layer thickness.

7. The integrated circuit of claim 6, wherein:
   the PMOS field effect transistor and the NMOS field effect transistor of the inverter circuit have a gate oxide layer having a fourth thickness; and
   the first layer thickness is smaller than the fourth layer thickness.

8. The integrated circuit of claim 1, further comprising:
   a second clock transistor, the first source/drain terminal of which is coupled to the output of the PMOS logic circuit and to the output of the NMOS logic circuit, wherein the clock signal is applied to the gate terminal of the second clock transistor, and wherein the first operating potential is fed to the second source/drain terminal.

9. The integrated circuit of claim 8, wherein the gate oxide layer of the second clock transistor is thicker than the respective gate oxide layer of at least the portion of the NMOS field effect transistors of the NMOS logic circuit.

10. The integrated circuit of claim 8, wherein the gate oxide layer of the second clock transistor is thicker than the respective gate oxide layer of at least the portion of the PMOS field effect transistors of the PMOS logic circuit.

11. The integrated circuit of claim 1, wherein the inverter circuit has a PMOS field effect transistor and an NMOS field effect transistor.

12. The integrated circuit of claim 11, wherein the gate oxide layer of the NMOS field effect transistor of the inverter circuit is thicker than the gate oxide layer of the PMOS field effect transistor of the inverter circuit.

13. The integrated circuit 12, wherein a first field effect transistor is connected between the PMOS field effect transistor of the inverter circuit and the first operating potential, the gate oxide layer of said first field effect transistor being thinner than the gate oxide layer of the NMOS field effect transistor of the inverter circuit.

14. The integrated circuit of claim 13, further comprising a second field effect transistor connected between the input of the inverter circuit and the second operating potential, the gate oxide layer of said second field effect transistor being thicker than the gate oxide layer of the first field effect transistor.

15. The integrated circuit of claim 14, further comprising a second power switch transistor connected between the second field effect transistor and the second operating potential, the gate oxide layer of said second power switch transistor being thicker than the gate oxide layer of the first field effect transistor.

16. The integrated circuit of claim 1, wherein the third threshold voltage is lower than the second threshold voltage.

17. An integrated circuit including a CMOS circuit arrangement, comprising:
- a PMOS logic circuit providing a logic function, having PMOS field effect transistors, wherein a first operating potential is fed to an input of the PMOS logic circuit;
- an NMOS logic circuit providing the logic function, having NMOS field effect transistors;
- a first clock transistor, the first source/drain terminal of which is coupled to an input of the NMOS logic circuit, wherein a clock signal is applied to the gate terminal of the first clock transistor, and wherein a second operating potential is fed to the second source/drain terminal;
- wherein an output of the PMOS logic circuit and an output of the NMOS logic circuit are coupled to one another;
- an inverter circuit coupled to the output of the PMOS logic circuit and to the output of the NMOS logic circuit;
- wherein at least a portion of the NMOS field effect transistors of the NMOS logic circuit have a first threshold voltage;
- wherein at least a portion of the PMOS field effect transistors of the PMOS logic circuit have a first threshold voltage;
- wherein the first clock transistor has a second threshold voltage;
- wherein the first threshold voltage is lower than the second threshold voltage; and
- wherein the first threshold voltage or the third threshold voltage is lower than the threshold voltage of the second clock transistor.

18. An integrated circuit including a CMOS circuit arrangement, comprising:
- a PMOS logic circuit providing a logic function, having PMOS field effect transistors, wherein a first on operating potential is fed to an input of the PMOS logic circuit;
- an NMOS logic circuit providing the logic function, having NMOS field effect transistors;
- a first clock transistor, the first source/drain terminal of which is coupled to an input of the NMOS logic circuit, wherein a clock signal is applied to the pate terminal of the first clock transistor, and wherein a second operating potential is fed to the second source/drain terminal;
- wherein an output of the PMOS logic circuit and an output of the NMOS logic circuit are coupled to one another;
- an inverter circuit coupled to the output of the PMOS logic circuit and to the output of the NMOS logic circuit;
- wherein at least a portion of the NMOS field effect transistors of the NMOS logic circuit have a first threshold voltage;
- wherein at least a portion of the PMOS field effect transistors of the PMOS logic circuit have a third threshold voltage;
- wherein the first clock transistor has a second threshold voltage;
- wherein the first threshold voltage is lower than the second threshold voltage; and
- wherein a first power switch transistor is connected between the PMOS field effect transistor of the inverter circuit and the first operating potential, the gate oxide layer of said first power switch transistor being ticker than the gate oxide layer of the PMOS field effect transistor of the inverter circuit.

19. The integrated circuit of claim 18, wherein the inverse clock signal can be applied to the gate terminal of the first power switch transistor.

20. An integrated circuit including a CMOS circuit arrangement, comprising:
- a plurality of PMOS field effect transistors configured as a PMOS logic gate having an input with a first operating potential and having an output;
- a plurality of NMOS field effect transistors configured as an NMOS logic gate having an input and an output;
- a clock transistor having a first drain/source terminal coupled to the input of the NMOS logic gate, a gate terminal coupled to a clock signal, and a second drain/source terminal coupled to a second operating potential; and
- an inverter circuit coupled to the outputs of the PMOS and NMOS logic gates;
- wherein the outputs of the PMOS and NMOS logic gates are coupled together;
- wherein the plurality of NMOS field effect transistors have a gate oxide layer with a first thickness, the clock transistor has a gate oxide layer of a second thickness, and the plurality of PMOS field effect transistors have a gate oxide layer with a third thickness; and
- wherein the first thicknesses is less than the second thickness.

21. The integrated circuit of claim 20, wherein the first and third thicknesses are not equal to each other.

22. The integrated circuit of claim 20, wherein the third thickness is less than the second thickness.

* * * * *